(12) United States Patent
Connor et al.

(10) Patent No.: US 11,855,341 B2
(45) Date of Patent: Dec. 26, 2023

(54) ELECTROCHEMICALLY CONTROLLED CAPILLARITY TO DYNAMICALLY CONNECT PORTIONS OF AN ELECTRICAL CIRCUIT

(71) Applicant: International Business Machines Corporation, Armonk, NY (US)

(72) Inventors: Samuel Connor, Apex, NC (US); Joseph Kuczynski, North Port, FL (US); Matthew Doyle, Chatfield, MN (US); Stuart B. Benefield, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 17/457,353

(22) Filed: Dec. 2, 2021

(65) Prior Publication Data
US 2022/0094045 A1 Mar. 24, 2022

Related U.S. Application Data

(62) Division of application No. 16/185,763, filed on Nov. 9, 2018, now Pat. No. 11,201,393.

(51) Int. Cl.
*H01Q 1/36* (2006.01)
*H01Q 1/38* (2006.01)
*H05K 3/06* (2006.01)

(52) U.S. Cl.
CPC .............. *H01Q 1/364* (2013.01); *H01Q 1/38* (2013.01); *H05K 3/06* (2013.01); *H05K 2203/0165* (2013.01)

(58) Field of Classification Search
CPC ............. H01Q 1/38; H01Q 1/364; H05K 3/06
See application file for complete search history.

(56) References Cited

U.S. PATENT DOCUMENTS 5,494,764 A 2/1996 Hyodo
8,669,834 B2 * 3/2014 Cheng .................... H01P 3/121
333/248

(Continued)

FOREIGN PATENT DOCUMENTS

WO 2004086832 A1 10/2004

OTHER PUBLICATIONS

Nagels et al., "Fabrication Approaches to Interconnect Based Devices for Stretchable Electronics: a Review", MDPI 2018. http://www.mdpi.com/journal/materials.

(Continued)

*Primary Examiner* — Lam T Mai
(74) *Attorney, Agent, or Firm* — Patterson + Sheridan, LLP

(57) ABSTRACT

Embodiments herein describe a capillary containing a eutectic conductive liquid (e.g., EGaIn) and an electrolyte (e.g., NaOH) that is integrated into a printed circuit board (PCB). In one embodiment, the PCB includes a capillary, a negative electrode, a positive electrode, a plurality of insulation layers, and a conductive layer. The capillary extends through the PCB. The capillary includes a side surface forming an annular cylinder. A eutectic conductive liquid and an electrolyte are disposed within an aperture formed by the side surface. An electrode extends through the side surface and contacts at least the eutectic conductive liquid or the electrolyte. The negative electrode is disposed at a first end of the capillary. The positive electrode is disposed at a second end of the capillary. The conductive layer is disposed between two of the plurality of insulation layers. The electrode forms an electrical connection with the conductive layer.

12 Claims, 6 Drawing Sheets

(56) References Cited

U.S. PATENT DOCUMENTS

| | | | |
|---|---|---|---|
| 9,704,793 B2 | 7/2017 | Sekine et al. | |
| 9,826,644 B2 | 11/2017 | Lazaro Gallego | |
| 9,899,732 B2 | 2/2018 | Urcia, Jr. et al. | |
| 10,834,829 B1* | 11/2020 | Benefield | H01Q 1/364 |
| 10,990,864 B2 | 4/2021 | Cao et al. | |
| 2004/0000483 A1 | 1/2004 | Jackson et al. | |
| 2006/0029955 A1 | 2/2006 | Guia et al. | |
| 2006/0125076 A1 | 6/2006 | Fukagaya et al. | |
| 2006/0213613 A1 | 9/2006 | Gallego et al. | |
| 2008/0093702 A1* | 4/2008 | Cheng | H01L 23/5227 |
| | | | 257/528 |
| 2012/0312384 A1 | 12/2012 | Robinson et al. | |
| 2012/0328933 A1 | 12/2012 | Gong et al. | |
| 2013/0209872 A1 | 8/2013 | Asal et al. | |
| 2017/0093002 A1 | 3/2017 | Choi et al. | |
| 2017/0237157 A1* | 8/2017 | Urcia, Jr. | H01Q 1/085 |
| | | | 343/705 |
| 2017/0315274 A1 | 11/2017 | Park et al. | |
| 2018/0021892 A1 | 1/2018 | Ye et al. | |
| 2018/0269828 A1 | 9/2018 | Beck | |
| 2020/0153089 A1* | 5/2020 | Connor | H05K 3/06 |

OTHER PUBLICATIONS

Wang et al., "A reconfigurable liquid metal antenna driven by electrochemically controlled capillarity," Journal of Applied Physics, 194901 (2015); doi: 10.1063/1.4919605.

Khan et al., "A Pressure Responsive Fluidic Microstrip Open Stub Resonator Using a Liquid Metal Alloy," IEEE Microwave and Wireless Components Letters, vol. 22, No. 11, Nov. 2012.

Vial, Closure and Septa Selection Guide—Sigma Aldrich, viewed Aug. 27, 2018. https://www.sigmaaldrich.com/analytical-chromatography/vials/learning-center/selection-guide.html.

"List of IBM Patents or Patent Applications Treated as Related," for U.S. Appl. No. 17/457,353, filed Dec. 2, 2021.

* cited by examiner

ELECTROCHEMICALLY CONTROLLED CAPILLARITY TO DYNAMICALLY CONNECT PORTIONS OF AN ELECTRICAL CIRCUIT

CROSS-REFERENCE TO RELATED APPLICATIONS

This application is a divisional of co-pending U.S. patent application Ser. No. 16/185,763, filed Nov. 9, 2018. The aforementioned related patent application is herein incorporated by reference in its entirety.

BACKGROUND

The present invention relates to eutectic conductive material, and more specifically, to disposing a capillary of eutectic conductive liquid in a printed circuit board or flex circuit.

Reconfigurable radiofrequency (RF) electronics are used to enable adaptive, multifunctional radios for wireless sensing and communications. Conventionally, reconfigurable components have employed switched electro-mechanical circuit elements (e.g., diodes and varactors) on the device to change its RF properties. However, the circuit elements have a limited number and range of states. To construct more versatile tunable systems, liquid metals have recently been used in a variety of reconfigurable microwave components—filters frequency selective surfaces (FSS) and antennas. In these applications, the liquid conductors are pneumatically actuated via pumps or contact pressure to change RF current paths. While the enhanced control over the conductor length and location provided by a liquid conductor greatly enhances the tuning range of the devices, the introduction of pumps and microfluidic elements adds to system complexity and requires a closed fluid path, limiting the device topology.

Gallium alloys have attracted attention for reconfigurable electronics because of their liquid state at room temperature and their non-toxicity compared to mercury. For example, eutectic gallium indium (EGaIn), is a eutectic (lowest melting point composition) mixture of gallium (75%) and indium (25%) with a conductivity of $3.4\times10^6$ S/m. Although EGaIn reacts with air to form a surface oxide that can stick to surfaces including the inner walls of capillaries, this adhesion can be avoided by injecting the metal into capillaries pre-filled with electrolyte. The electrolyte forms a slip layer between the oxide and the walls of the capillary.

SUMMARY

One embodiment of the present disclosure is a method that includes providing a capillary comprising a side surface forming an annular cylinder, wherein at least one electrode extends through the side surface, inserting the capillary into a through hole of a printed circuit board (PCB) such that a first portion of the at least one electrode is electrically connected to a conductive layer in the PCB, injecting a eutectic conductive liquid and an electrolyte into an aperture formed by the side surface where at least one of the eutectic conductive liquid and the electrolyte contacts a second portion of the at least one electrode, disposing a negative electrode at a first end of the capillary and a positive electrode at a second end of the capillary opposite the first end, and sealing the capillary after the capillary is inserted into the through hole so that the eutectic conductive liquid and the electrolyte are contained within the aperture formed by the side surface.

Another embodiment of the present disclosure is a PCB that includes a capillary extending through the PCB where the capillary comprises side surface forming an annular cylinder, where a eutectic conductive liquid and an electrolyte are disposed within an aperture formed by the side surface, where at least one electrode extends through the side surface, and where a first portion of the at least one electrode contacts at least one of the eutectic conductive liquid and the electrolyte. The PCB also includes a negative electrode disposed at a first end of the capillary, a positive electrode disposed at a second end of the capillary, a plurality of insulation layers, and a conductive layer disposed between two of the plurality of insulation layers, wherein a second portion of the at least one electrode forms an electrical connection with the conductive layer.

Another embodiment of the present disclosure is a capillary network that includes a first capillary, a first negative electrode extending through the first capillary, a second capillary in fluid communication with the first capillary, a second negative electrode extending through the second capillary, a reservoir in fluid communication with both the first capillary and the second capillary, a positive electrode extending through the reservoir, and control circuitry configured to control DC voltages on the first negative electrode, the second negative electrode, and the positive electrode so that a eutectic conductive liquid selectively extends from the reservoir to one of the first capillary and the second capillary.

DETAILED DESCRIPTION

Embodiments herein describe a capillary containing a eutectic conductive liquid (e.g., EGaIn) and an electrolyte (e.g., NaOH) that is integrated into a printed circuit board (PCB). In one embodiment, the capillary is formed in a through-hole in the PCB and has negative and positive electrodes at its respective ends to seal the eutectic conductive liquid and the electrolyte. The capillary further includes one or more wiper electrodes that extend through a side portion of the capillary containing the liquids. The wiper electrodes also make electrical contact with respective conductive layers in the PCB. Using a DC voltage between the negative and positive electrodes, the eutectic conductive liquid can form electrical connections between the wiper electrodes, which in turn, forms electrical connections between the conductive layers in the PCB. By controlling which of the wiper electrodes are electrically coupled via the eutectic conductive liquid, the capillary can selectively couple different circuitry in, or on, the PCB. For example, the capillary can control a tuning circuit for changing the operating frequency of an antenna. In other examples, the capillary can be used to isolate circuitry in the case of unauthorized probing by a nefarious actor, electrically connect newly added circuitry (e.g., RAM placed in an expansion slot) to other circuitry in the PCB, and the like.

Figure 1:
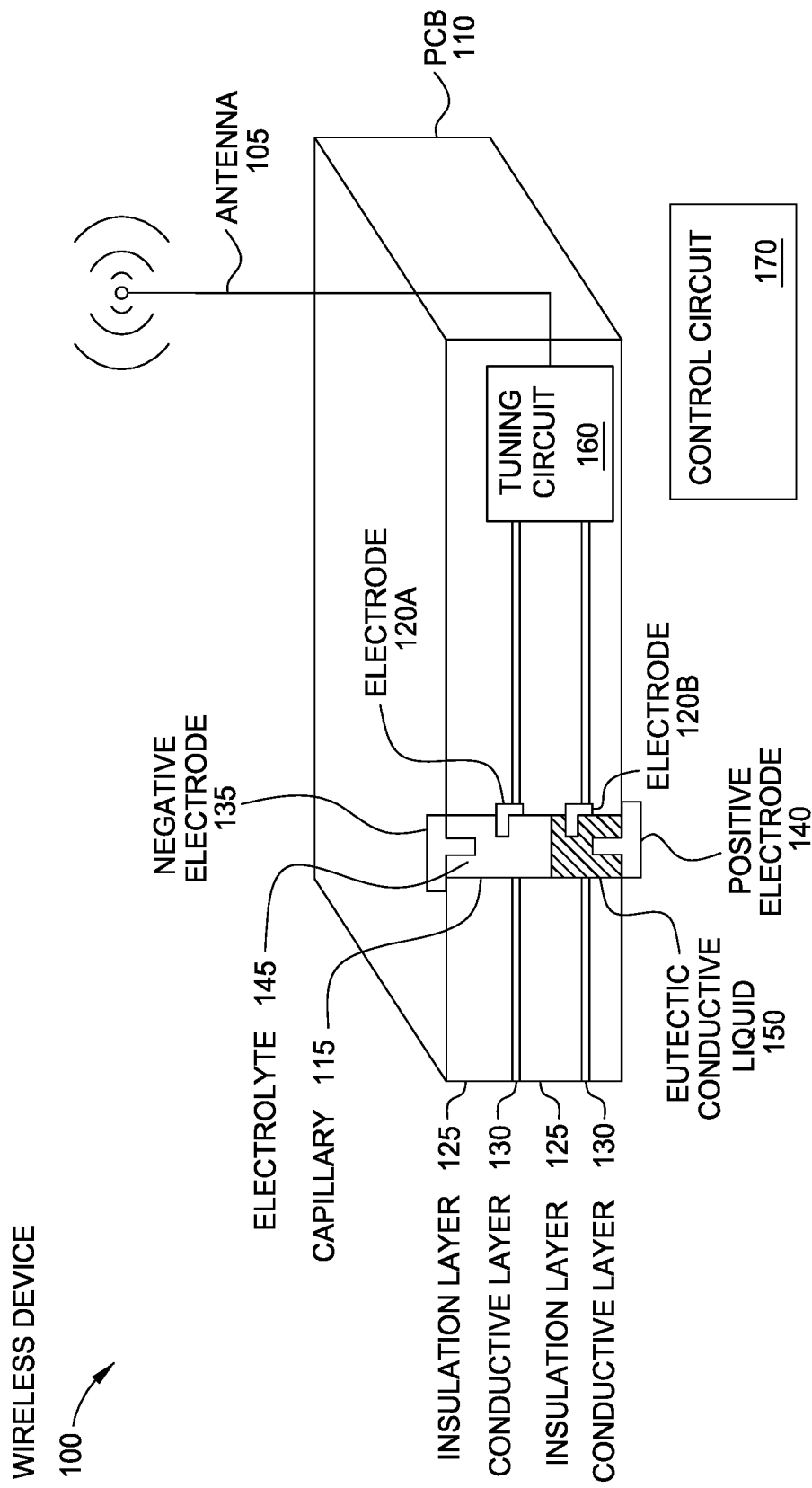
FIG. 1 illustrates a wireless device with a tuning circuit controlled by a capillary with a eutectic conductive liquid, according to one embodiment described herein.

FIG. 1 illustrates a wireless device 100 with a tuning circuit 160 controlled by a capillary 115 with a eutectic conductive liquid 150, according to one embodiment described herein. The wireless device 100 includes an antenna 105 and a PCB 110 but can contain other electrical and mechanical components. For example, the wireless device 100 may be a mobile device such as a smart phone, tablet, or laptop. In other examples, the wireless device 100 could be a base station in a cellular network (e.g., a 5G wireless network).

The antenna 105 can be separate from the PCB 110 or formed in one of the conductive layers 130 in the PCB 110 (e.g., a patch antenna). In one embodiment, the antenna 105 is used to perform 5G wireless communication. 5G communication often requires the antenna 105 to tune over a wide range of operating frequencies. Current electro-mechanical solutions are too slow at tuning the antenna 105 or are ill-suited for being disposed within a wireless device 100. However, the capillary 115, when used with the tuning circuit 160 can quickly change the operating frequency of the antenna 105 to perform 5G communication while being easily integrated into the PCB 110.

The PCB 110 includes a plurality of insulation layers 125, which are formed from a non-conductive material, that separate conductive layers 130. The conductive layers 130 may be copper foil that is laminated on the non-conductive material of the insulation layers 125. Chemical etching can be used to form traces or tracks in the copper foil in the conductive layers 130. Although not shown, vias can be used to pass electrical connections between the conductive layers 130. The PCB 110 is a multi-layered PCB since it includes multiple iterations of insulation layers 125 and conductive layers 130. Although two lamination layers are shown, the PCB 110 can include any number of layers.

A tuning circuit 160 is electrically connected to the conductive layers 130 and to the antenna 105. As discussed below, the location of the eutectic conductive liquid 150 controls the operation of the tuning circuit 160 which in turn tunes the operating frequency of the antenna 105. That is, the eutectic conductive liquid 150 can form an electrical connection between the conductive layers 130 (or break an electrical connection between the layers 130) which affects that operating frequency of the antenna 105.

The capillary 115 extends through all the layers in the PCB 110. A negative electrode 135 is disposed on a top side of the capillary 115 and a positive electrode 140 is disposed on a bottom side of the capillary 115. A control circuit 170 (which can be disposed on the PCB 110 or external thereof) controls the voltages applied to the negative electrodes 135 and the positive electrode 140 in order to control the length of the eutectic conductive liquid 150 in the capillary 115. Applying a DC voltage between the negative electrode 135 and positive electrode 140 controls the length at which the eutectic conductive liquid 150 extends in the capillary 115. For example, if the control circuit 170 applies a negative voltage and the electrodes 135 and 140 are reverse biased (e.g., the negative electrode has a higher voltage than the positive electrode 140), the eutectic liquid 150 pools at the bottom of the capillary 115 near the positive electrode 140. However, when the control circuit 170 applies a positive voltage and the electrodes 135 and 140 are forward biased (e.g., the negative electrode 135 has a lower voltage than the positive electrode 140), the eutectic liquid 150 begins to extend up toward the negative electrode 135. The length at which the eutectic liquid 150 extends in the capillary 115 can be controlled by the voltage difference between the electrodes 135 and 140.

Put differently, by applying a DC voltage, the length of the eutectic conductive liquid 150 in the capillary 115 is controlled to either extend the liquid 150 from the positive electrode 140 towards the negative electrode 135 or conversely, to shorten the length of the liquid 150 in a direction towards the positive electrode 140. Oxidation of the leading surface of the eutectic conductive liquid 150 can lower the interfacial tension of the liquid 150. The capillary 115 can be tuned such that the Laplace pressure of the eutectic conductive liquid 150 causes the eutectic conductive liquid 150 to flow upwards in the capillary 115 and the electrical length increases. Reversing the polarity of the DC potential electrochemically reduces the oxide layer at the leading surface and returns the eutectic conductive liquid 150 to a state of large tension (a process called "recapillarity"). In the absence of the oxide layer, Laplace pressure moves the eutectic conductive liquid 150 towards the positive electrode 140, shortening the metal filament and filling the vacated space with the electrolyte 145.

As the positive DC voltage between the electrodes 135 and 140 increases, the eutectic conductive liquid 150 extends up towards the negative electrode 135. Eventually, the eutectic liquid 150 reaches the electrode 120A, thereby forming an electrical connection between the electrodes 120A and 120B. Stated differently, as the eutectic conductive liquid 150 rises, it contacts both of the electrodes 120A and 120B forming a conductive path between them. Because the electrodes 120A and 120B also are electrically coupled to respective ones of the conductive layers 130, the conductive path in the liquid 150 electrically couples the conductive layers 130. Electrically connecting the layers 130 controls the tuning circuit 160 to change the operating frequency (e.g., the resonant frequency) of the antenna 105. For example, electrically coupling the conductive layers 130 may increase or decreases the resistance, capacitance, and/or inductance of the tuning circuit 160 which changes the operating frequency of the antenna 105.

In one embodiment, an applied DC voltage can be used to prevent the eutectic liquid 150 from moving when the device is flipped over (as is the case in a portable electronic device). That is, if the PCB 110 is inverted where the positive electrode 140 is above the negative electrode 135 and gravity pulls the eutectic liquid 150 down, the eutectic liquid 150 does not extend done unless a forward biased DC voltage is applied between the electrodes 135 and 140. In one embodiment, the control circuit 170 reverse biases the electrodes 135 and 140 (when no connection between the electrodes 120 is desired) which prevents gravity (or the capillary action) from extending the length of the eutectic liquid 150 in the capillary 115 regardless of the orientation of the wireless device 100. If the PCB 110 is mounted in a fixed device (e.g., a device that would not be rotated during operation), then the electrodes may not be reversed biased since gravity holds in the eutectic liquid in the default (non-connected) state illustrated in FIG. 1.

However, if the device containing the PCB 110 could be oriented arbitrarily during use, in one embodiment the system can use data from an accelerometer in the PCB 110 to determine which end of the capillary 115 is down with respect to gravitational forces and treat that side as the base electrode (e.g., electrode 120B) and establish the DC bias accordingly. In another embodiment, two capillaries 115 could be disposed side-by-side in the PCB 110 where the bias circuitry is wired in opposite directions. While one capillary is forward-biased, the other is reverse biased, so whichever capillary is right-side-up (relative to gravity) has the appropriate forward-bias to extend the eutectic liquid 150. The right-side-down capillary, on the other hand, is reverse-biased and keeps the eutectic liquid 150 in a non-extended state. This approach uses more space on the PCB 110, but does not require the added complexity of reading an accelerometer to determine the orientation.

While FIG. 1 illustrates two electrodes 120 and two layers 130, the capillary 115 may include three, four, five, etc. electrodes 120 which each couple to respective conductive layers 130. As the eutectic liquid 150 rises in the capillary 115, the liquid 150 may electrically couple more of the electrodes 120 which in turn increases (or decreases) the operating frequency of the antenna 105. When the length of the eutectic liquid 150 in the capillary 115 shrinks (the positive DC voltage is reduced), the liquid 150 may electrically couple fewer of the electrodes 120 which in turn decreases (or increases) the operating frequency of the antenna 105. Thus, adding more electrodes 120 may increase the granularity at which the operating frequency of the antenna 105 can be controlled by the tuning circuit 160.

Moreover, gallium is very corrosive to many/most metals which makes using an EGaIn material as the liquid 150 difficult without destroying the electrodes 120. In one embodiment, the electrodes 120 are plated with tantalum which gallium does not corrode. In another embodiment, vapor deposit is used to form a thin film of Au on, e.g., a Cu electrode. The oxide enhances wetting to the Au and the electrocapillarity may be controlled to form a layer that the gallium does not corrode.

The eutectic conductive liquid 150 can be a gallium alloy (e.g., EGaIn) but is not limited to such. The liquid 150 can be any conductive material that is a liquid at room temperature and can be predictively controlled using an applied voltage. However, for simplicity, the remaining discussion assumes the liquid 150 is EGaIn.

Moreover, while FIG. 1 illustrates using an EGaIn capillary 115 to tune an antenna 105, the embodiments herein are not limited to such. In another embodiment, the PCB 110 and the capillary 115 may be used in a crypto card application where in response to detecting an unauthorized probe trace, the control circuit 170 moves a trace via a new connection or short circuits the PCB 110 to prevent a nefarious actor from probing the device. That is, once an intrusion is detected, the control circuit 170 can control the capillary 115 to change the connection using the height of the EGaIn column resulting in a new circuit path or short circuiting the card. In another embodiment, the capillary permits circuit in, or on the PCB to connect to newly added circuitry. For example, the PCB 110 may include expansion slots for receiving new RAM modules, additional CPUs, additional GPUs, and the like. The control circuit 170 can use one or more capillaries 115 in the PCB 110 to connect the newly added hardware elements to circuit or paths already in the PCB 110. In yet another example, the capillary 115 can be used in self-healing circuits. For example, if a system detects that a signal is stuck in a low or high state due to a broken or shorted connection (e.g., due to a cracked solder joint or Conductive Anodic Filaments (CAF) growth), the system can adjust the bias on the capillary 115 and engage a spare pathway thereby restoring system function.

Figure 2:
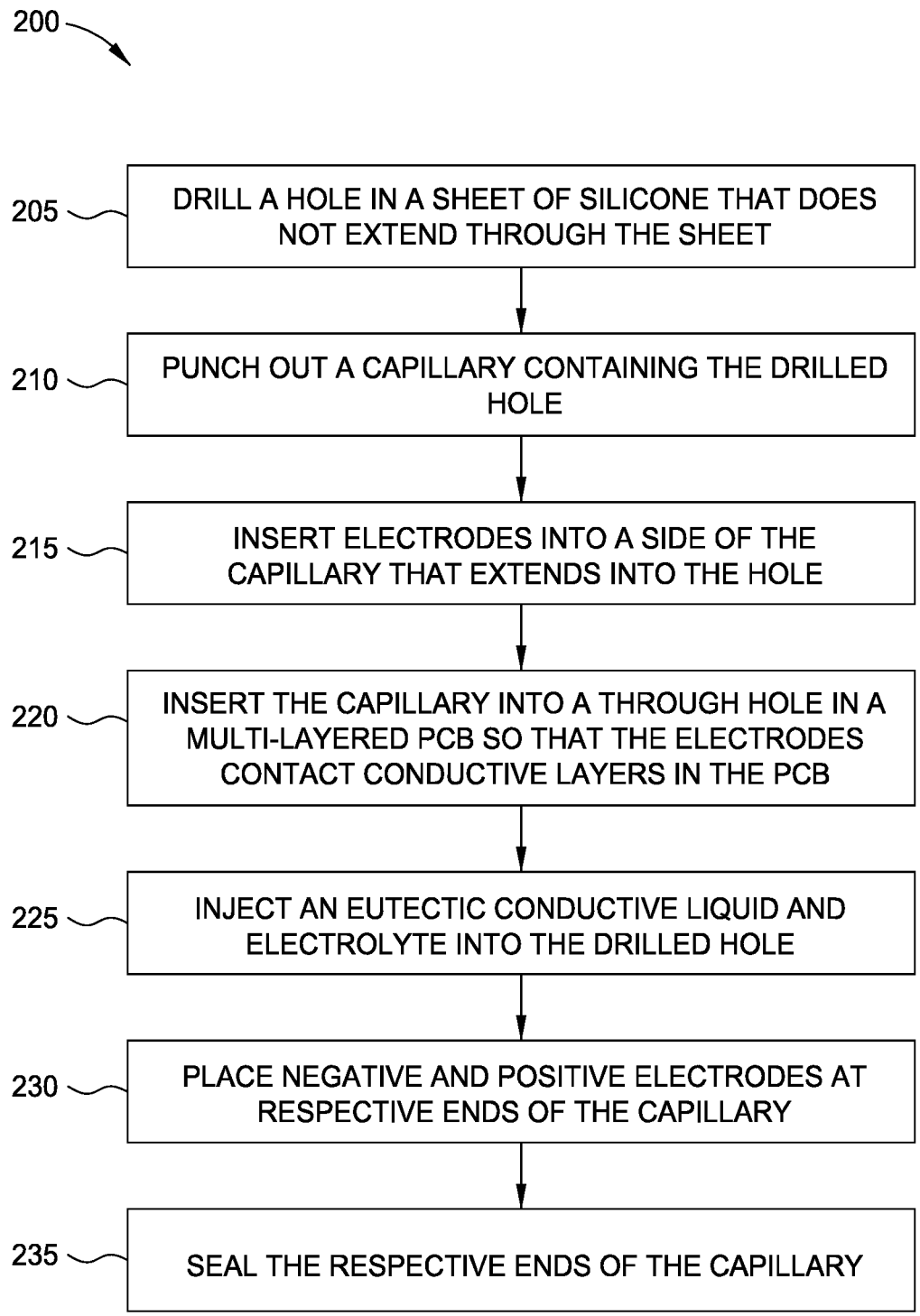
FIG. 2 illustrates a flowchart for forming a capillary containing a eutectic conductive liquid in a printed circuit board, according to one embodiment described herein.

FIG. 2 illustrates a flowchart of a method 200 for forming a capillary containing a eutectic conductive liquid in a PCB, according to one embodiment described herein. For clarity, the blocks of the method 200 are discussed in parallel with FIGS. 3-8 which illustrate various steps for forming a capillary in a multi-layered PCB.

Figure 3:
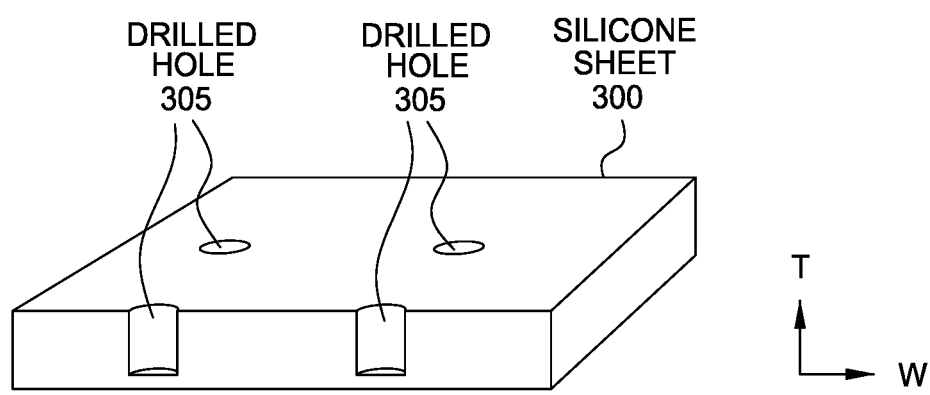
FIG. 3 illustrates drilled holes for forming a capillary, according to one embodiment described herein.

At block 205, a machine or technician drills a hole in a sheet of silicone such that the hole does not extend through the sheet. For example, FIG. 3 illustrates drilled holes 305 for forming a capillary, according to one embodiment described herein. The holes 305 are formed in a sheet 300 of silicone which, in one embodiment, has a thickness (T) that is slightly greater (e.g., 1-10% greater) than the thickness of the PCB in which the capillary is going to be formed. In one embodiment, the thickness of the sheet 300 (and the corresponding PCB) may range from 50 mils to 300 mils, which varies depending on the number of layers in the PCB.

The width (W) of the holes 305 define the space in which the EGaIn and electrolyte will be disposed when the capillary is formed in the PCB. The width can vary, but should be selected so that a capillary action can be used to extend or shrink the EGaIn within the hole 305 as described above.

Although silicone is described, this is only one suitable material. In one embodiment, any material can be used to form the sides of the capillary as long as the material permits the capillary action described above. Other suitable materials may include rubber or polytetrafluoroethylene-based materials.

At block 210, a machine or technician punches out a capillary containing the drilled hole. For example, a region around each of the holes 305 illustrated in FIG. 3 can be punched out to form respective capillaries, which in this example, have a cylindrical shape.

Figure 4A:
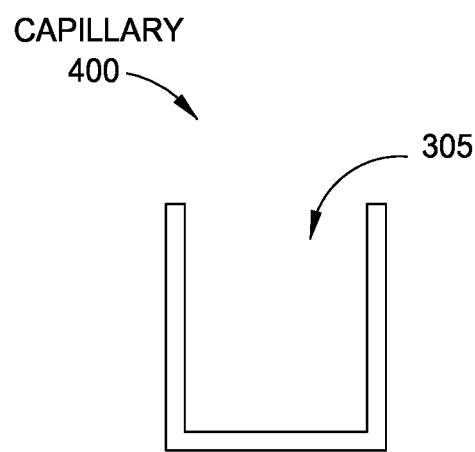
FIGS. 4A and 4B illustrate a cylindrically capillary, according to one embodiment described herein.
Figure 4B:
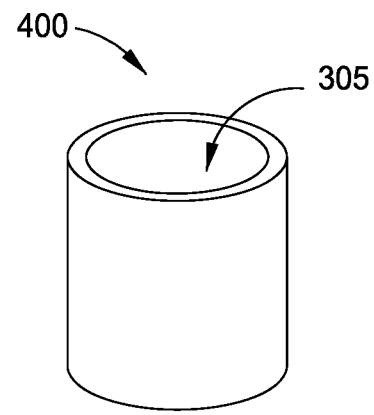

FIGS. 4A and 4B illustrate a cylindrically capillary, according to one embodiment described herein. Specifically, FIG. 4A illustrates a cross section of a capillary 400 that can be formed by punching out a region around the holes 305 formed in the sheet 300 in FIG. 3. FIG. 4B illustrates a plan view of the capillary 400. Because the hole 305 does not extend through the capillary 400, the capillary 400 includes a bottom surface but no top surface. An annular cylindrical side surface of the capillary 400 extends around the hole 305.

Figure 5:
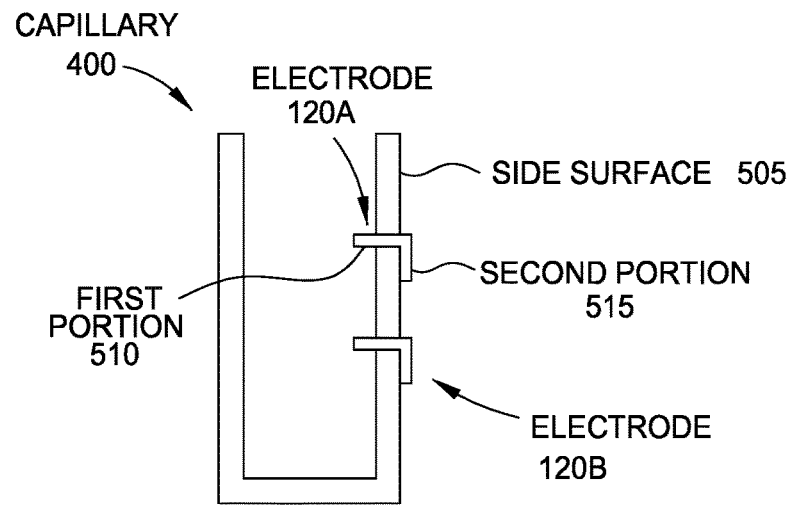
FIG. 5 illustrates inserting electrodes into a side of the capillary, according to one embodiment described herein.

At block 215, a machine or technician inserts electrodes into a side of the capillary that extend into the hole. FIG. 5 illustrates inserting electrodes 120 into a side surface 505 of the capillary 400 illustrated in FIG. 4, according to one embodiment described herein. The silicone material of the capillary 400 is self-sealing so that inserting the electrodes 120A and 120B through the side surface 505 does not create a path through which the EGaIn and electrolyte liquid (which are inserted into the capillary 400 in later steps) can leak.

The electrodes 120 (also referred to as wiper electrodes) each have a first portion 510 that extends into the hole formed by the side surface 505 and a second portion 515 that remains on the outside of the capillary 400. The first portions 510 extend far enough into the hole so that when the EGaIn liquid extends through the hole, the EGaIn liquid contacts the first portions 510 of the electrodes 120. Thus, the EGaIn liquid can form electrical connections between the electrodes 120. However, when the first portion 510 contacts the electrolyte, the electrode 120 is insulated from the other electrodes 120

In one embodiment, the electrodes 120 are inserted into the side surface 505 with a spacing that correspond to a spacing of the conductive layers in the PCB. For example, if the layers of the PCB are spaced apart 5 mils, the electrodes 120 may be spaced apart by 5 mils along the side surface 505. Thus, when the capillary 400 is placed in the PCB as discussed below, the second portions 515 can be aligned with, and make electrical connections to, respective conductive layers in the PCB.

Figure 6:
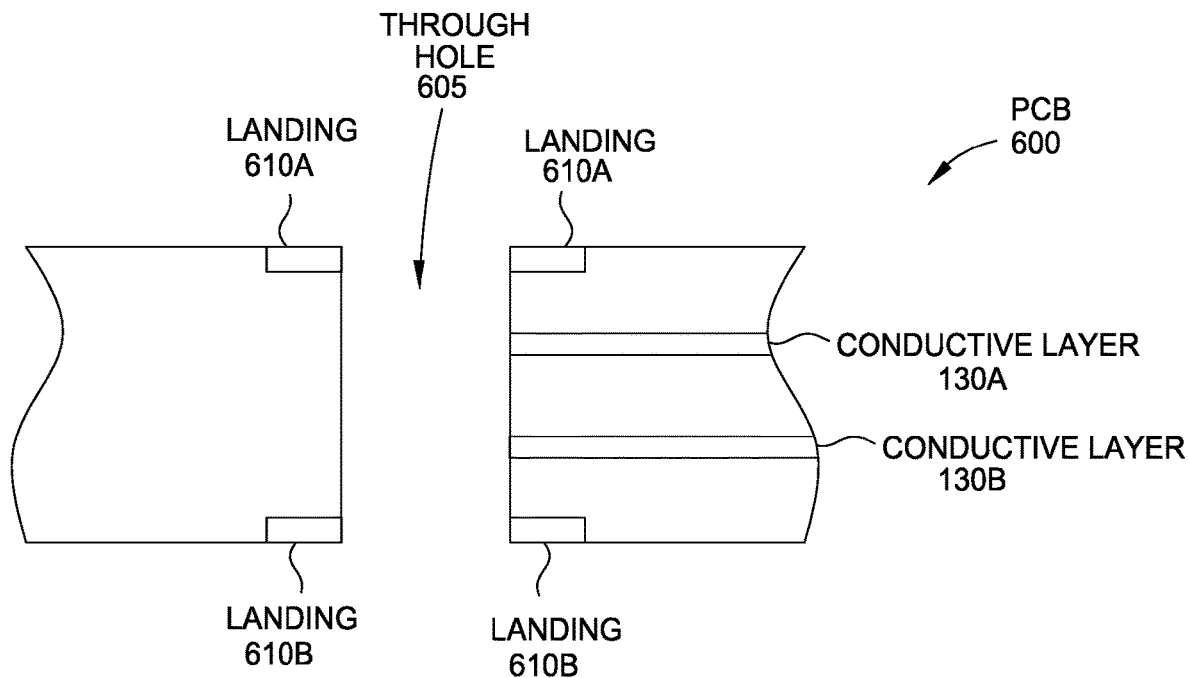
FIG. 6 illustrates a through hole in a printed circuit board, according to one embodiment described herein.

At block 220, a machine or technician inserts the capillary into a through hole in a multi-layered PCB so that the electrodes contact conductive layers in the PCB. FIG. 6 illustrates a through hole 605 in a PCB 600, according to one embodiment described herein. Specifically, FIG. 6 illustrates a cross section of the PCB 600. In one embodiment, the through hole 605 is a plated through hole (PTH). The through hole 605 may have a diameter or width that corresponds to the diameter of the side surface 505 of the capillary 400 so that the capillary 400 can fit inside the through hole 605.

The PCB 600 also includes a landing 610A disposed around a top of the through hole 605 and a landing 610B disposed around a bottom of the through hole 605. The landings 610 can form a bond pad or bonding surface around the through hole 605 which can be used to electrically couple the capillary to control logic in later processing steps.

Figure 7:
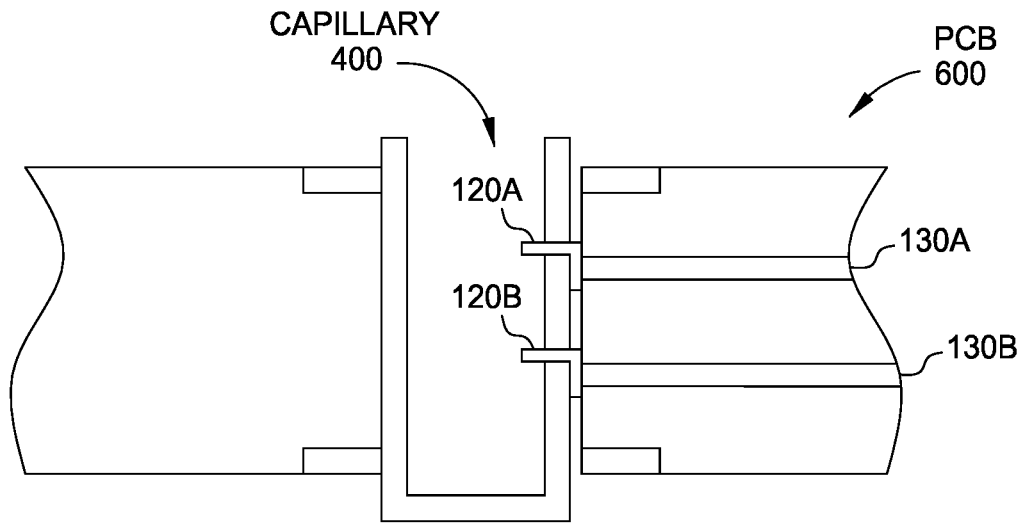
FIG. 7 illustrates inserting the capillary in FIG. 5 into the through hole of the printed circuit board in FIG. 5, according to one embodiment described herein.

FIG. 7 illustrates inserting the capillary 400 in FIG. 5 into the through hole 605 of the PCB 600 in FIG. 5, according to one embodiment described herein. As shown, the position of the capillary 400 relative to the PCB 600 is controlled so that the electrodes 120A and 120B align to respective conductive surfaces 130A and 130B to form electrical connections therebetween.

At block 225, a machine or technician injects a eutectic conductive liquid (e.g., EGaIn) and an electrolyte (e.g., NaOH) into the drilled hole of the capillary 400. For example, the technician may use a needle or pipet to insert a desired ratio of EGaIn and electrolyte into the capillary. In one embodiment, the technician may fill the drilled hole in the capillary completely with a ratio of the EGaIn and electrolyte. However, in another embodiment, a portion of the capillary may include an air pocket—i.e., the capillary is not completely filled.

Figure 8:
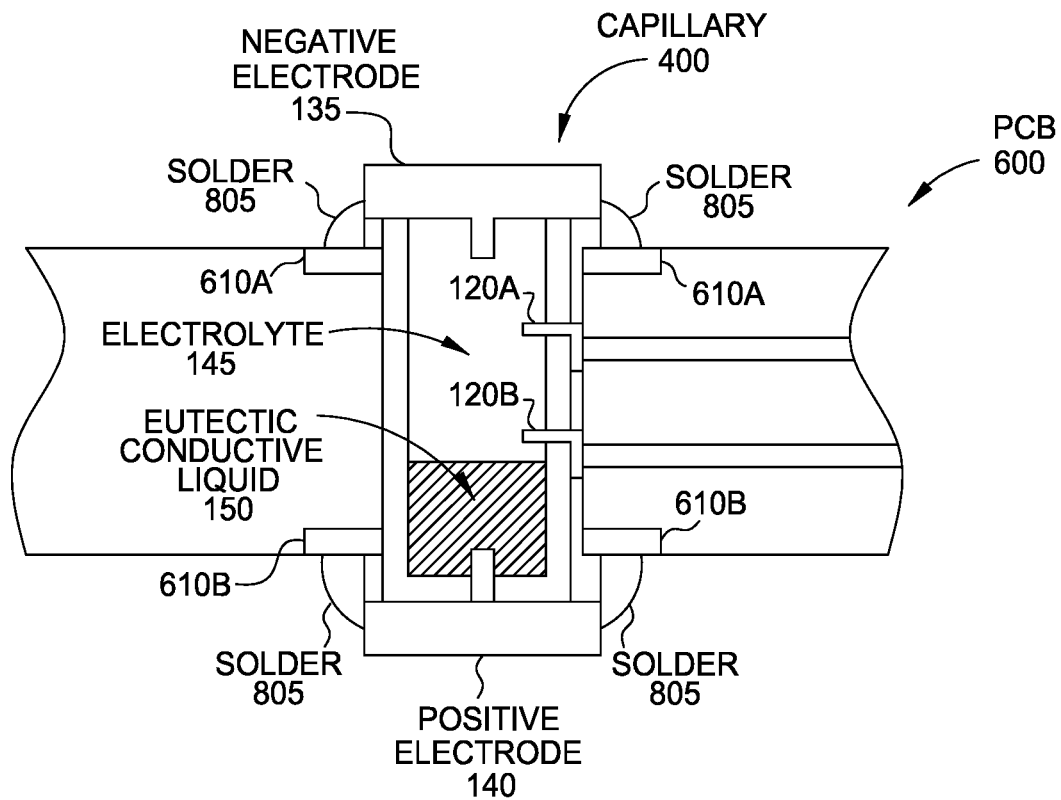
FIG. 8 illustrates filling the capillary with electrolyte and a eutectic conducting liquid and mounting electrodes at the ends of the capillary, according to one embodiment described herein.

At block 230, a machine or technician places negative and positive electrodes at respective ends of the capillary. FIG. 8 illustrates mounting the negative electrode 135 and the positive electrode 140 at the ends of the capillary 400, according to one embodiment described herein. As shown, the negative electrode 135 is disposed over the side surface of the capillary 400. The positive electrode 140 is pushed through the bottom of the capillary 400 so that at least a portion of the positive electrode 140 extends into the hole and contacts the liquid 150.

At block 235, a machine or technician seals the respective ends of the capillary 400 so that the electrolyte 145 and the eutectic conductive liquid 150 cannot escape the capillary 400 regardless of the orientation of the PCB 600. To seal the top end of the capillary 400 and electrically connect the negative electrode 135, solder is 805 is formed around the capillary 400 and the negative electrode 135. In one embodiment, the solder 805 provides a dual purpose by holding the negative electrode 135 in place to seal the top of the capillary 400 (and prevent the electrolyte 145 and conductive liquid 150 from escaping) as well as electrically connecting the negative electrode to the landing 610A. Although not shown, the landing 610A is electrically connected to control circuitry which drives a DC voltage onto the negative electrode 135.

In another embodiment, rather than resting the negative electrode 135 on top of the side surface of the capillary 400, the diameter of the negative electrode 135 may be approximately the same as the diameter of the hole in the capillary 400 so that the negative electrode 135 can be pressed down into the hole. This may improve the seal the negative electrode 135 forms at the top of the capillary 400. Although a portion of the negative electrode 135 is in the hole, the electrode 135 can nonetheless be solder bonded or wire bonded to the landing 610A.

Because the bottom surface of the capillary is not open like the top surface, the positive electrode 140 is pushed through the bottom of the capillary 400. Like when inserting the electrodes 120 into the side of the capillary 400, inserting the positive electrode 140 through silicone may also be self-sealing. However, if not, the bottom surface can nonetheless be sealed by soldering the positive electrode 140 to the landing 610B. The solder 805 also electrically connects the positive electrode 140 to the landing 610B which is in turn electrically connected to the control circuitry. In this manner, the control circuitry can drive DC voltages onto the negative electrode 135 and the positive electrode 140 to control the length at which the liquid 150 extends through the capillary 400.

While FIG. 8 illustrates two electrodes 120 and two conductive layers 130, the capillary 400 can include any number of electrodes 120 and conductive layers 130. For example, when using the capillary in conjunction with a tuning circuit, the capillary 400 may include five, six, seven, etc. electrodes 120. In another example, the capillary 400 may include only one electrode 120 inserted in its side. In this example, the positive electrode 140 could be dual purposed to apply a DC voltage to control the length of the eutectic liquid 150 as well as an AC signal which can be transmitted, via the liquid 150 to the wiper electrode 120.

Figure 9:
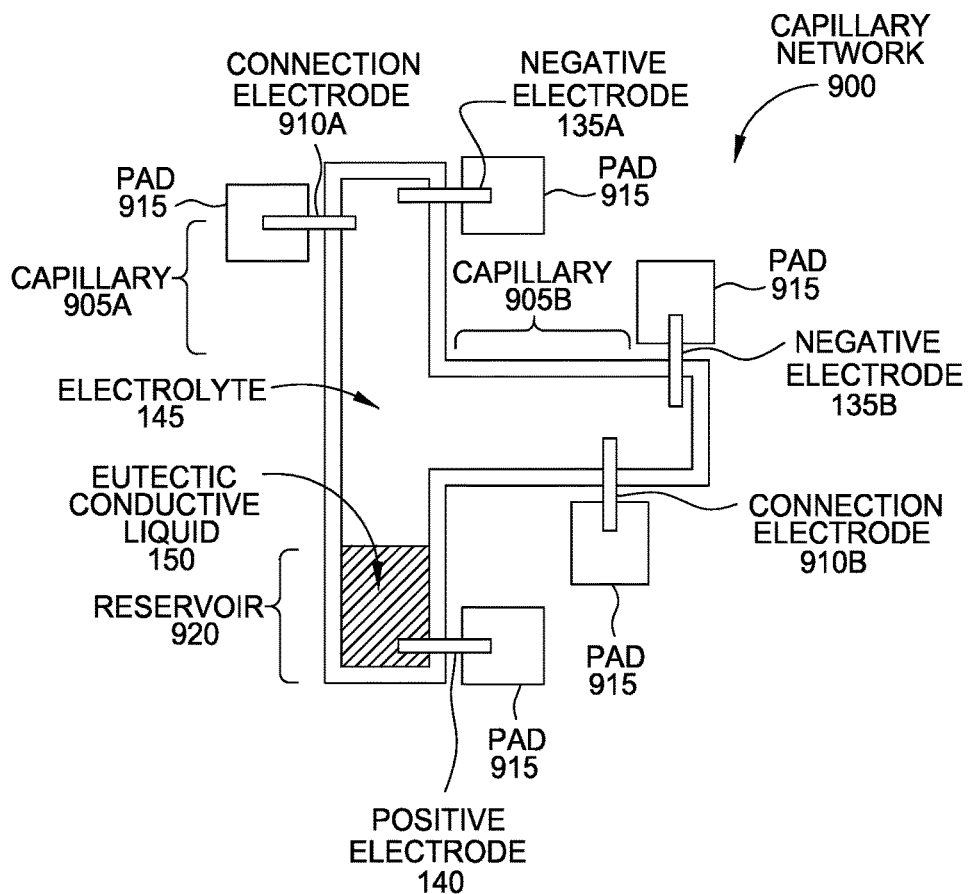
FIG. 9 illustrates a network of capillaries, according to one embodiment described herein.

FIG. 9 illustrates a network of capillaries 905, according to one embodiment described herein. That is, FIG. 9 illustrates a capillary network 900 that includes a first capillary 905A, a second capillary 905B, and a reservoir 920. FIG. 9 provides a top view of the capillaries 905 which may be disposed horizontally in (or on) a PCB in contrast to FIGS. 1 and 8 which illustrate a capillary that extends vertically in a PCB. In this example, the first capillary 905A and the second capillary 905 extend along different axes—e.g., the first capillary 905A is perpendicular to the second capillary 905 and form a T-junction along with the reservoir 920.

The network 900 includes two negative electrodes 135A and 135B and a positive electrode 140. When the DC voltage is reversed biased between both of the negative electrodes 135A and 135B and the positive electrode 140, the eutectic conductive liquid 150 remains in the reservoir 920 proximate to the positive electrode 140. However, the control circuit can forward bias the voltage between one of the negative electrodes 135 and the positive electrode 140 to establish an electrical path between the positive electrode 140 and one of the connection electrodes 910.

For example, in a first mode of operation, the control circuit may forward bias the voltages between the negative electrode 135A and the positive electrode 140 while maintaining the reverse bias between the negative electrode 135B and the positive electrode 140. That is, the negative electrode 135A has a lower voltage than the positive electrode 140, while the negative electrode 135B has a higher voltage than the positive electrode 140. As a result, the EGaIn liquid extends through the capillary 905A but not the capillary 905B. As the positive bias between the negative electrode 135A and the positive electrode 140 increases, eventually the EGaIn forms an electrical connection between the positive electrode 140 and the connection electrode 910A.

In a second mode of operation, the control circuit may forward bias the voltages between the negative electrode 135B and the positive electrode 140 while maintaining the reverse bias between the negative electrode 135A and the positive electrode 140. That is, the negative electrode 135B has a lower voltage than the positive electrode 140, while the negative electrode 135A has a higher voltage than the positive electrode 140. As a result, the EGaIn liquid extends through the capillary 905B but not the capillary 905A. As the positive bias between the negative electrode 135B and the positive electrode 140 increases, eventually the EGaIn forms an electrical connection between the positive electrode 140 and the connection electrode 910B.

The capillary network 900 can be used in a variety of circuits. For example, the network 900 may be used to select pull-up or pull-down termination for a signal, select a path with more or less delay for timing optimization, or tune a resonator by adding or removing inductance or capacitance depending on which connection electrode 910 is electrically coupled to the positive electrode 140. Further, although two capillaries 905 are in the network 900, the network 900 could include additional capillaries with a corresponding connection electrodes 910 and negative electrodes 135.

The connection electrodes 910, negative electrodes 135, and the positive electrode 140 can be coupled to an underlying conductive layer via respective pads 915. For example, the capillary network 900 may be formed in an internal layer of a PCB where the pads 915 are part of a conductive layer in the PCB. In another embodiment, the capillary network 900 may be mounted on an outer layer of the PCB where the pads 915 are bond pads that can be soldered to the electrodes 910, 135, and 140.

The capillaries 905 can be formed using a similar process as explained above except that the capillaries 905 are not disposed in through holes in the PCB. Rather, the capillary network can be formed, filled with the liquid material, and sealed before being disposed in or on the PCB. When disposing the capillary network 900 on the PCB, soldering the electrodes 910, 135, and 140 onto the pads 915 in the PCB can hold the network 900 in place.

Figure 10:
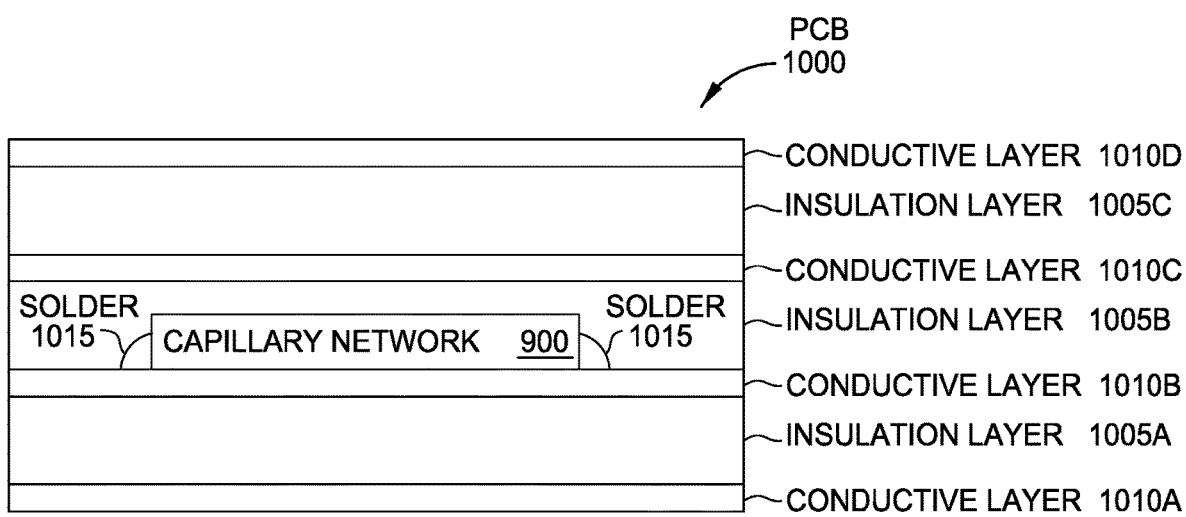
FIG. 10 illustrates disposing the network of capillaries in FIG. 9 into a layer of a printed circuit board, according to one embodiment described herein.

FIG. 10 illustrates disposing the network 900 of capillaries in FIG. 9 into a layer of a PCB, according to one embodiment described herein. In one embodiment, the capillary network 900 is mounted onto the PCB 1000 after the conductive layer 1010A, the insulation layer 1005A, and the conductive layer 1010B has been formed but before the insulation layer 1005B, conductive layer 1010C, insulation layer 1005C, and the conductive layer 1010D have been formed.

In one embodiment, the conductive layer 1010B may be patterned to form the pads 915 illustrated in FIG. 9 and solder 1015 can be used to connect the various electrodes in the capillary network 900 to the pads 915 in the layer 1010B. Once connected, the insulation layer 1005B can be formed around and on the capillary network 900 to encapsulate the capillary network 900 in an internal layer in the PCB 1000. The additional conductive layers 1010C and 1010D and the insulation layer 1005C can then be formed. Thus, the capillary network 900 is hidden from anyone viewing the PCB 1000. However, as mentioned above, rather than disposing the capillary network 900 in the PCB 1000, in another embodiment, the network 900 can be disposed on the outer layers of the PCB—i.e., the conductive layers 1010A and 1010D.

As used herein and in the claims, "at least one of A and B" covers the options of only A, only B, and the combination of A and B.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described above, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described above are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A printed circuit board (PCB), comprising:
a capillary extending through the PCB, wherein the capillary comprises a side surface forming an annular cylinder, wherein a eutectic conductive liquid and an electrolyte are disposed within an aperture formed by the side surface, wherein at least one electrode extends through the side surface, and wherein a first portion of the at least one electrode contacts at least one of the eutectic conductive liquid or the electrolyte;
a negative electrode disposed at a first end of the capillary;
a positive electrode disposed at a second end of the capillary;
a plurality of insulation layers; and
a conductive layer disposed between two of the plurality of insulation layers, wherein a second portion of the at least one electrode forms an electrical connection with the conductive layer.

2. The PCB of claim 1, further comprising:
a first landing disposed on a first outer surface of the PCB, wherein the first landing is connected via solder to the negative electrode; and
a second landing disposed on a second outer surface of the PCB, wherein the second landing is connected via solder to the positive electrode.

3. The PCB of claim 2, wherein the first and second landings surround the side surface of the capillary.

4. The PCB of claim 1, wherein a plurality of electrodes extends through the side surface, wherein first portions of the plurality of electrodes contact at least one of the eutectic conductive liquid or the electrolyte and second portions of the plurality of electrodes form electrical connections with a plurality of conductive layers in the PCB.

5. The PCB of claim 4, wherein each of the plurality of insulation layers is disposed between a pair of the plurality of conductive layers.

6. A capillary network, comprising:
   a first capillary;
   a first negative electrode extending through the first capillary;
   a second capillary in fluid communication with the first capillary;
   a second negative electrode extending through the second capillary;
   a reservoir in fluid communication with both the first capillary and the second capillary;
   a positive electrode extending through the reservoir; and
   control circuitry configured to control DC voltages on the first negative electrode, the second negative electrode, and the positive electrode so that a eutectic conductive liquid selectively extends from the reservoir to one of the first capillary and the second capillary.

7. The capillary network of claim 6, wherein the first capillary extends along a different axis than the second capillary.

8. The capillary network of claim 7, wherein the first capillary, the second capillary, and the reservoir form a T-junction.

9. The capillary network of claim 6, further comprising:
   a first connection electrode extending through the first capillary; and
   a second connection electrode extending through the second capillary,
   wherein the control circuitry is configured to control the DC voltages to selectively form, using the eutectic conductive liquid, one of a first electrical path between the positive electrode and the first connection electrode and a second electrical path between the positive electrode and the second connection electrode.

10. The capillary network of claim 9, further comprising:
    a printed circuit board (PCB) comprising a plurality of pads, wherein the first negative electrode, the second negative electrode, the positive electrode, the first connection electrode, and the second connection electrode are coupled to respective ones of the plurality of pads.

11. The capillary network of claim 10, wherein the first capillary, the second capillary, and the reservoir are mounted on an outer surface of the PCB.

12. The capillary network of claim 10, wherein the plurality of pads is in a first conductive layer in the PCB, wherein the first capillary, the second capillary, and the reservoir are disposed in an internal layer of the PCB between the first conductive layer and a second conductive layer.

* * * * *